US012567853B2

(12) United States Patent
Taguchi

(10) Patent No.: US 12,567,853 B2
(45) Date of Patent: Mar. 3, 2026

(54) ACOUSTIC WAVE FILTER AND MULTIPLEXER

(71) Applicant: Murata Manufacturing Co., Ltd., Nagaokakyo (JP)

(72) Inventor: Tomoko Taguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 207 days.

(21) Appl. No.: 18/221,446

(22) Filed: Jul. 13, 2023

(65) Prior Publication Data

US 2023/0412143 A1 Dec. 21, 2023

Related U.S. Application Data

(63) Continuation of application No. PCT/JP2022/001711, filed on Jan. 19, 2022.

(30) Foreign Application Priority Data

Jan. 25, 2021 (JP) ................................. 2021-009341

(51) Int. Cl.
*H03H 9/145* (2006.01)
*H03H 9/25* (2006.01)
(Continued)

(52) U.S. Cl.
CPC .............. *H03H 9/145* (2013.01); *H03H 9/25* (2013.01); *H03H 9/6483* (2013.01); *H03H 9/72* (2013.01)

(58) Field of Classification Search
CPC ........ H03H 9/145; H03H 9/25; H03H 9/6483; H03H 9/72; H03H 9/0274; H03H 9/14526; H03H 9/1457; H03H 9/02574
See application file for complete search history.

(56) References Cited

U.S. PATENT DOCUMENTS

2013/0285768 A1 10/2013 Watanabe et al.
2019/0363695 A1* 11/2019 Taguchi ............... H03H 9/6483
(Continued)

FOREIGN PATENT DOCUMENTS

JP 2020123819 A 8/2020
WO 2012086639 A1 6/2012
(Continued)

OTHER PUBLICATIONS

International Search Report in PCT/JP2022/001711, mailed Mar. 29, 2022, 3 pages.
(Continued)

*Primary Examiner* — John W Poos
(74) *Attorney, Agent, or Firm* — Keating & Bennett, LLP

(57) ABSTRACT

An acoustic wave filter includes one or more series arm resonators and one or more parallel arm resonators each including an acoustic wave resonator with an IDT electrode on a substrate. The substrate includes a piezoelectric film and a high acoustic velocity support substrate. The IDT electrode includes a pair of comb-shaped electrodes. A floating withdrawal electrode is an electrode finger that is not coupled to either busbar electrode of the pair of comb-shaped electrodes. A polarity-inverting withdrawal electrode is an electrode finger that is coupled to the same busbar electrode as adjacent electrode fingers on both sides with respect to the electrode finger. At least one of the one or more series arm resonators includes the IDT electrode including a polarity-inverting withdrawal electrode. At least one of the one or more parallel arm resonators includes the IDT electrode including a floating withdrawal electrode.

20 Claims, 10 Drawing Sheets

(51) Int. Cl.
    *H03H 9/64*       (2006.01)
    *H03H 9/72*       (2006.01)

(56)           References Cited

U.S. PATENT DOCUMENTS

| | | | |
|---|---|---|---|
| 2020/0091892 A1 | | 3/2020 | Watanabe et al. |
| 2020/0244247 A1* | | 7/2020 | Maeda ................. H03H 9/6483 |
| 2020/0280302 A1 | | 9/2020 | Miyamoto |
| 2020/0280303 A1* | | 9/2020 | Takamine ............ H03H 9/6479 |
| 2021/0143796 A1* | | 5/2021 | Takata ............... H03H 9/14526 |
| 2022/0123717 A1 | | 4/2022 | Takeuchi |

FOREIGN PATENT DOCUMENTS

| | | |
|---|---|---|
| WO | 2018216417 A1 | 11/2018 |
| WO | 2019131530 A1 | 7/2019 |
| WO | 2021002321 A1 | 1/2021 |

OTHER PUBLICATIONS

Written Opinion in PCT/JP2022/001711, mailed Mar. 29, 2022, 4 pages.

* cited by examiner

SURFACE ACOUSTIC
WAVE PROPAGATION
DIRECTION

ACOUSTIC WAVE FILTER AND MULTIPLEXER

CROSS REFERENCE TO RELATED APPLICATIONS

This application claims the benefit of priority to Japanese Patent Application No. 2021-009341 filed on Jan. 25, 2021 and is a Continuation Application of PCT Application No. PCT/JP2022/001711 filed on Jan. 19, 2022. The entire contents of each application are hereby incorporated herein by reference.

BACKGROUND OF THE INVENTION

1. Field of the Invention

The present invention relates to an acoustic wave filter and a multiplexer.

2. Description of the Related Art

Intervals between frequency bands allocated as communication bands for devices such as mobile phones are made relatively narrow for the purpose of efficiently using the frequency resource for wireless communications. Due to such frequency-band allocations, acoustic wave filters used in radio-frequency circuits for devices such as communication devices need to achieve low loss and high isolation from adjacent frequency band. An important performance indicator of low loss and high isolation can be satisfied by reducing frequency shifts with changes in temperature (decreasing the temperature coefficient of frequency (TCF)).

International Publication No. 2012/086639 discloses an acoustic wave device having a substrate structure formed by disposing a low acoustic velocity material layer between a piezoelectric material and a high acoustic velocity material layer. This structure reduces the absolute value of the TCF.

SUMMARY OF THE INVENTION

In acoustic wave ladder filters, the attenuation pole on the lower frequency side of the pass band is mainly determined by the resonance point of a parallel arm resonator, and the attenuation pole on the higher frequency side of the pass band is mainly determined by the anti-resonance point of a series arm resonator. For this reason, when the TCF of the parallel arm resonator and the TCF of the series arm resonator are relatively small, frequency shifts in the pass band and attenuation band with changes in temperature are also relatively small. As a result, it is possible to achieve favorable filter characteristic over a wide range of operating temperatures.

The acoustic wave device disclosed in International Publication No. 2012/086639, however, has a tendency in which, as the operating temperature rises, the resonance point of a parallel arm resonator shifts to the higher frequency side, and the anti-resonance point of a series arm resonator shifts to the lower frequency side. Accordingly, as the operating temperature rises, the pass band width narrows. This can cause degradation of filter bandpass characteristics such as increases in the insertion loss and decreases in the electric power handling capability at the pass-band edges.

Preferred embodiments of the present invention provide acoustic wave filters in each of which degradation of filter bandpass characteristics due to changes in temperature is reduced or prevented, and also provide multiplexers including the acoustic wave filters.

An acoustic wave filter according to an aspect of a preferred embodiment of the present invention includes a first input-output terminal and a second input-output terminal, one or more series arm resonators in a path connecting the first input-output terminal and the second input-output terminal, and one or more parallel arm resonators each between a node in the path and ground. Each of the one or more series arm resonators and the one or more parallel arm resonators includes an acoustic wave resonator including a substrate exhibiting piezoelectricity and an interdigital transducer (IDT) electrode on the substrate. The substrate includes a piezoelectric film with one surface including the IDT electrode and a high acoustic velocity support substrate. The acoustic velocity of a bulk wave propagating in the high acoustic velocity support substrate is higher than the acoustic velocity of an acoustic wave propagating along the piezoelectric film. The IDT electrode includes a pair of comb-shaped electrodes each including a plurality of electrode fingers that extend in a direction crossing an acoustic wave propagation direction and that are arranged in parallel to each other, and a busbar electrode that connects one-side ends of electrode fingers of the plurality of electrode fingers to each other. When a floating withdrawal electrode is defined as an electrode finger that is not coupled to either busbar electrode of the pair of comb-shaped electrodes among the plurality of electrode fingers, and a polarity-inverting withdrawal electrode is defined as an electrode finger that is coupled to the same busbar electrode as adjacent electrode fingers on both sides with respect to the electrode finger among the plurality of electrode fingers, at least one of the one or more series arm resonators includes the IDT electrode including the polarity-inverting withdrawal electrode, and at least one of the one or more parallel arm resonators includes the IDT electrode including the floating withdrawal electrode.

Preferred embodiments of the present invention provide acoustic wave filters in each of which degradation of filter bandpass characteristics due to changes in temperature is reduced or prevented and also provide multiplexers including the acoustic wave filters.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
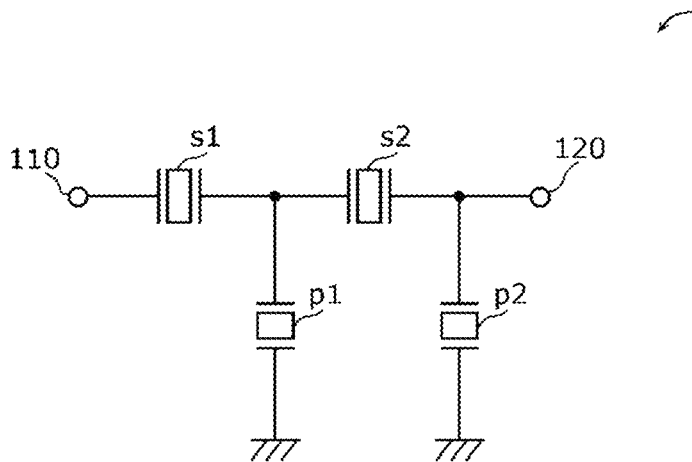
FIG. 1 is a circuit configuration diagram of an acoustic wave filter according to a first preferred embodiment of the present invention.

Hereinafter, preferred embodiments of the present invention will be described in detail. It should be noted that the preferred embodiments described below are comprehensive or specific instances. Specifics including numerical values, shapes, materials, elements, arrangements of the elements, and modes of connection given in the following preferred embodiments are merely examples and are not intended to limit the present invention. Among the elements in the following preferred embodiments, elements not recited in any of the independent claims are described as arbitrary elements. The size or size ratio of the elements illustrated in the drawings is not necessarily presented in an exact manner.

First Preferred Embodiment 1.1 Circuit Configuration of Acoustic Wave Filter 1

FIG. 1 is a circuit configuration diagram of an acoustic wave filter 1 according to a first preferred embodiment. As illustrated in the drawing, the acoustic wave filter 1 includes series arm resonators s1 and s2, parallel arm resonators p1 and p2, and input-output terminals 110 and 120.

The series arm resonators s1 and s2 are provided in a path connecting the input-output terminal 110 (a first input-output terminal) and the input-output terminal 120 (a second input-output terminal), coupled in series with each other. Each of the parallel arm resonators p1 and p2 is provided between a node in the path and the ground.

It is sufficient that one or more series arm resonators be provided. It is sufficient that one or more parallel arm resonators be provided.

Circuit elements such as an inductor and a capacitor and a circuit element such as a longitudinally coupled resonator may be inserted among the series arm resonators s1 and s2, the parallel arm resonators p1 and p2, the input-output terminals 110 and 120, and the ground.

With the configuration described above, the acoustic wave filter 1 defines a band-pass ladder filter.

The following describes a basic structure of the series arm resonators and parallel arm resonators of the acoustic wave filter 1.

1.2 Structure of Acoustic Wave Resonator

Figures 2A, 2B, 2C:
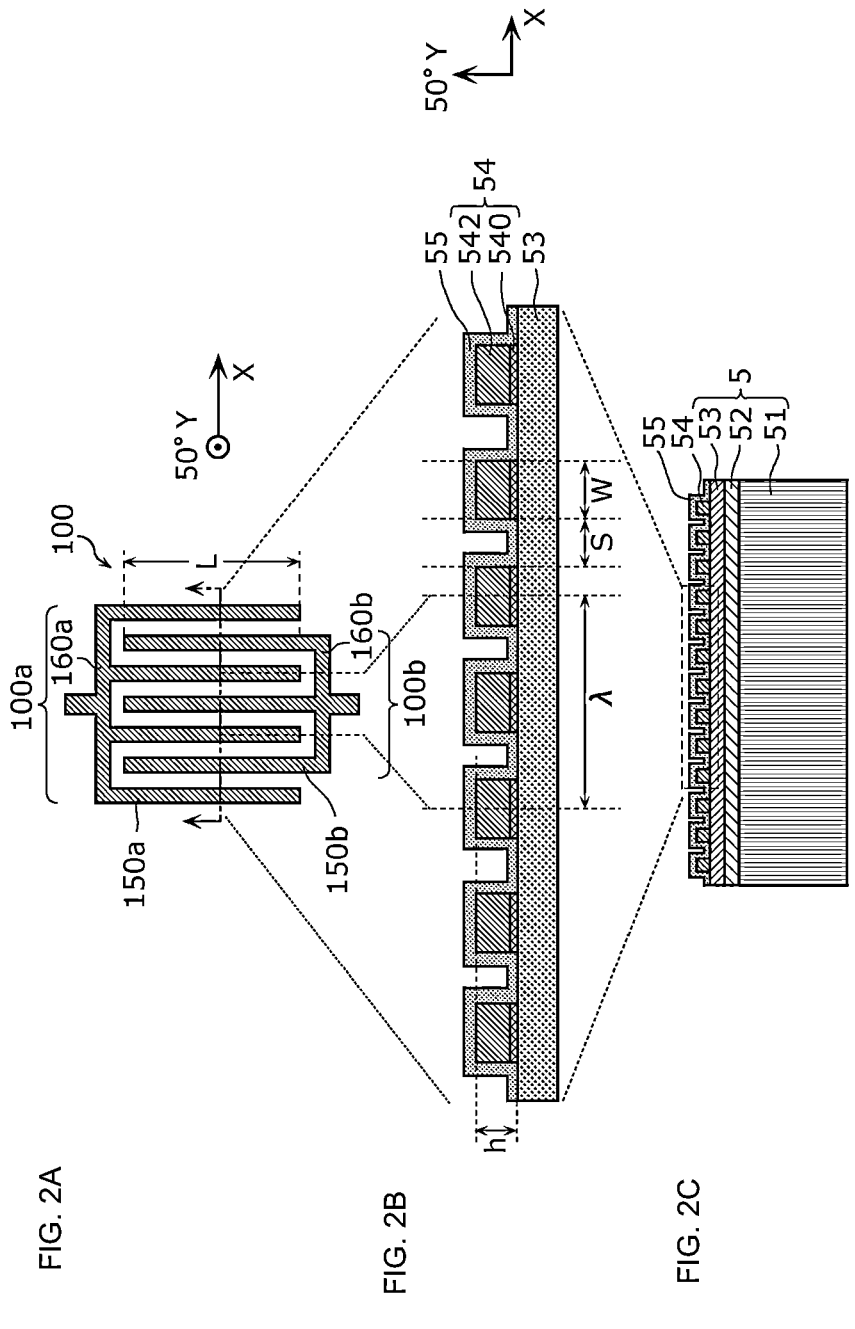
FIGS. 2A to 2C provide plan views and sectional views schematically illustrating an example of an acoustic wave resonator according to the first preferred embodiment of the present invention.

FIGS. 2A to 2C is a simple diagram schematically illustrating an example of an acoustic wave resonator according to the first preferred embodiment, in which FIG. 2A is a plan view, and FIGS. 2B and 2C are sectional views taken along a dot-dash line illustrated in FIG. 2A. The drawing indicates as an example an acoustic wave resonator 100 having a basic structure of the series arm resonators and parallel arm resonators of the acoustic wave filter 1. The acoustic wave resonator 100 illustrated in FIGS. 2A to 2C are used only to explain a typical structure of an acoustic wave resonator. The number of electrode fingers of an electrode, the length of electrode fingers, and other specifics are not limited to this example.

The acoustic wave resonator 100 includes a substrate 5 exhibiting piezoelectricity and comb-shaped electrodes 100a and 100b.

As illustrated in FIG. 2A, the comb-shaped electrodes 100a and 100b facing each other in a pair is formed on the substrate 5. The comb-shaped electrode 100a includes a plurality of electrode fingers 150a parallel to each other and a busbar electrode 160a connecting the electrode fingers 150a to each other. The comb-shaped electrode 100b includes a plurality of electrode fingers 150b parallel to each other and a busbar electrode 160b connecting the electrode fingers 150b to each other. The electrode fingers 150a and 150b extend in a direction perpendicular to the acoustic wave propagation direction (X-axis direction).

An interdigital transducer (IDT) electrode 54 including the electrode fingers 150a and 150b and the busbar electrodes 160a and 160b is formed as a layered structure of a fixing layer 540 and a main electrode layer 542 as illustrated in FIG. 2B.

The fixing layer 540 is a layer used to improve the firmness of the substrate 5 and the main electrode layer 542 and, for example, Ti is used as a material. The thickness of the fixing layer 540 is, for example, about 12 nm.

As a material of the main electrode layer 542, for example, Al including about 1% Cu is used. The thickness of the main electrode layer 542 is, for example, about 130 nm.

A protective layer 55 is formed to cover the comb-shaped electrodes 100a and 100b. The protective layer 55 is provided with the aim of, for example, protecting the main electrode layer 542 from external environment, controlling the frequency temperature characteristic, and increasing moisture resistance. The protective layer 55 is, for example, a dielectric film mainly made of silicon dioxide. The thickness of the protective layer 55 is, for example, 25 nm.

Materials forming the fixing layer 540, the main electrode layer 542, and the protective layer 55 are not limited to the materials described above. The IDT electrode 54 is not necessarily configured as the layered structure described above. The IDT electrode 54 may be formed of, for example, a metal, such as Ti, Al, Cu, Pt, Au, Ag, or Pd, or an alloy thereof, or may be including a plurality of multilayer bodies formed of the metal or the alloy. Additionally, the protective layer 55 is not necessarily provided.

Next, a layered structure of the substrate 5 will be described.

As illustrated in FIG. 2C, the substrate 5 includes a high acoustic velocity support substrate 51, a low acoustic velocity film 52, and a piezoelectric film 53, and has a structure formed by layering the high acoustic velocity support substrate 51, the low acoustic velocity film 52, and the piezo-electric film 53 in the order presented.

The piezoelectric film 53 is made of, for example, a 50° Y-cut X-propagation LiTaO3 piezoelectric single crystal or piezoelectric ceramic (a lithium tantalate single crystal or ceramic that is cut at a plane perpendicular to a normal line obtained by rotating an axis about an X-axis as a central axis by 50° from a Y-axis and in which surface acoustic waves propagate in the X-axis direction). The thickness of the piezoelectric film 53 is, for example, about 600 nm. The material and the cut-angle for a piezoelectric single crystal used for the piezoelectric film 53 are selected as appropriate in accordance with required specifications of individual filters.

The high acoustic velocity support substrate 51 is a substrate to support the low acoustic velocity film 52, the piezoelectric film 53, and the IDT electrode 54. The high acoustic velocity support substrate 51 is also a substrate configured such that bulk waves in the high acoustic velocity support substrate 51 are faster in velocity than acoustic waves such as surface acoustic waves and boundary waves propagating along the piezoelectric film 53. The high acoustic velocity support substrate 51 functions to confine surface acoustic waves in a portion formed by layering the piezo-electric film 53 and the low acoustic velocity film 52 so that the surface acoustic waves do not leak down below the high acoustic velocity support substrate 51. The high acoustic velocity support substrate 51 is, for example, a silicon substrate. The thickness of the high acoustic velocity support substrate 51 is, for example, about 200 μm.

The low acoustic velocity film 52 is configured such that the acoustic velocity of bulk waves in the low acoustic velocity film 52 is lower than the acoustic velocity of bulk waves propagating in the piezoelectric film 53. The low acoustic velocity film 52 is provided between the piezoelec-tric film 53 and the high acoustic velocity support substrate 51. This structure and a property of acoustic wave in which energy is naturally concentrated in low-acoustic-velocity media hinder leakage of surface acoustic wave energy outside the IDT electrode. The low acoustic velocity film 52 is a film mainly formed of, for example, silicon dioxide. The thickness of the low acoustic velocity film 52 is, for example, about 673 nm.

By using the layered structure of the substrate 5 described above, the Q factor at a resonant frequency and an anti-resonant frequency can be greatly increased in comparison to known structures in which a piezoelectric substrate is used as a single layer. As such, an acoustic wave resonator with a relatively high Q factor can be configured, and as a result, a filter with low insertion loss can be configured by using the acoustic wave resonator.

In the case in which a withdrawal electrode is used in an acoustic wave resonator as described later for the purpose of improving the sharpness at the pass-band edges of the acoustic wave filter 1, it is assumed that the Q factor of the acoustic wave resonator be equally decreased. By contrast, the layered substrate structure described above can maintain the Q factor of the acoustic wave resonator 100 at high values. As a result, it is possible to form the acoustic wave filter 1 in which the low-loss characteristic in the pass band is maintained.

The high acoustic velocity support substrate 51 may have a structure formed by layering a support substrate and a high acoustic velocity film configured such that bulk waves propagating in the high acoustic velocity film are faster in velocity than acoustic waves such as surface acoustic waves and boundary waves that propagate along the piezoelectric film 53. In this case, examples of a material used for the support substrate include: piezoelectric materials, such as sapphire, lithium tantalate, lithium niobate, and quartz-crystal; dielectric materials, such as various ceramics includ-ing alumina, magnesia, silicon nitride, aluminum nitride, silicon carbide, zirconia, cordierite, mullite, steatite, and forsterite, and glass; semiconductors, such as silicon and gallium nitride; and resin substrates. The high acoustic velocity film can be formed by using various high-acoustic-velocity materials including: aluminum nitride, aluminum oxide, silicon carbide, silicon nitride, silicon oxynitride, DLC films, or diamond; a medium mainly including the materials mentioned; and a medium mainly including a mixture of the materials mentioned. When the high acoustic velocity film is made of silicon nitride, the thickness of the high acoustic velocity film is, for example, about 900 nm.

The substrate on which the IDT electrode 54 is formed may have a structure formed by layering a support substrate, an energy confining layer, and a piezoelectric film in the order presented. With this structure, the IDT electrode 54 is formed on the piezoelectric film. As the piezoelectric film, for example, LiTaO$_3$ piezoelectric single crystal or a piezo-electric ceramic. The support substrate supports the piezo-electric film, the energy confining layer, and the IDT elec-trode 54.

The energy confining layer includes one or more layers. The velocity of bulk acoustic waves propagating in at least one layer of the layers is higher than the velocity of acoustic waves propagating close to the piezoelectric film. For example, the energy confining layer may have a layered structure including a low acoustic velocity film and a high acoustic velocity film. The acoustic velocity of bulk waves in the low acoustic velocity film is lower than the acoustic velocity of acoustic waves propagating in the piezoelectric film. The acoustic velocity of bulk waves in the high acoustic velocity film is lower than the acoustic velocity of acoustic waves propagating in the piezoelectric film. The support substrate may be formed as the high acoustic velocity film.

The energy confining layer may be an acoustic impedance layer including a low acoustic impedance layer having a relatively low acoustic impedance and a high acoustic impedance layer having a relatively high acoustic imped-ance that are alternately layered.

Here, an example of electrode parameters for the IDT electrode of the acoustic wave resonator 100 is described.

The wavelength of acoustic wave resonator is defined as a wavelength λ that is the repetition cycle of the electrode fingers 150a or 150b of the IDT electrode 54 illustrated in FIG. 2B. The electrode pitch is about ½ of the wavelength λ and defined as (W+S), where the line width of the electrode fingers 150a and 150b of the comb-shaped elec-trodes 100a and 100b is W and the space width between an electrode finger 150a and an electrode finger 150b is S. An overlap width L of the comb-shaped electrodes 100a and 100b in a pair is, as illustrated in FIG. 2A, the electrode finger length of the overlapping electrode fingers 150a and 150b as viewed in the propagation direction of acoustic waves (X-axis direction). The electrode duty of each acous-tic wave resonator is the line width occupancy rate of the electrode fingers 150a and 150b, that is, the rate of the line width to the sum of the line width and the space width of the electrode fingers 150a and 150b, which is defined as W/(W+S). The height of the comb-shaped electrodes 100a and 100b is h. In the following, parameters regarding the shape of the IDT electrode of the acoustic wave resonator, such as the wavelength λ, the overlap width L, the electrode duty, and the height h of the IDT electrode 54, are electrode parameters.

1.3 Operating Principle of Acoustic Wave Filter

The following describes an operating principle of the acoustic wave ladder filter according to the present preferred embodiment.

Figures 3A, 3B:
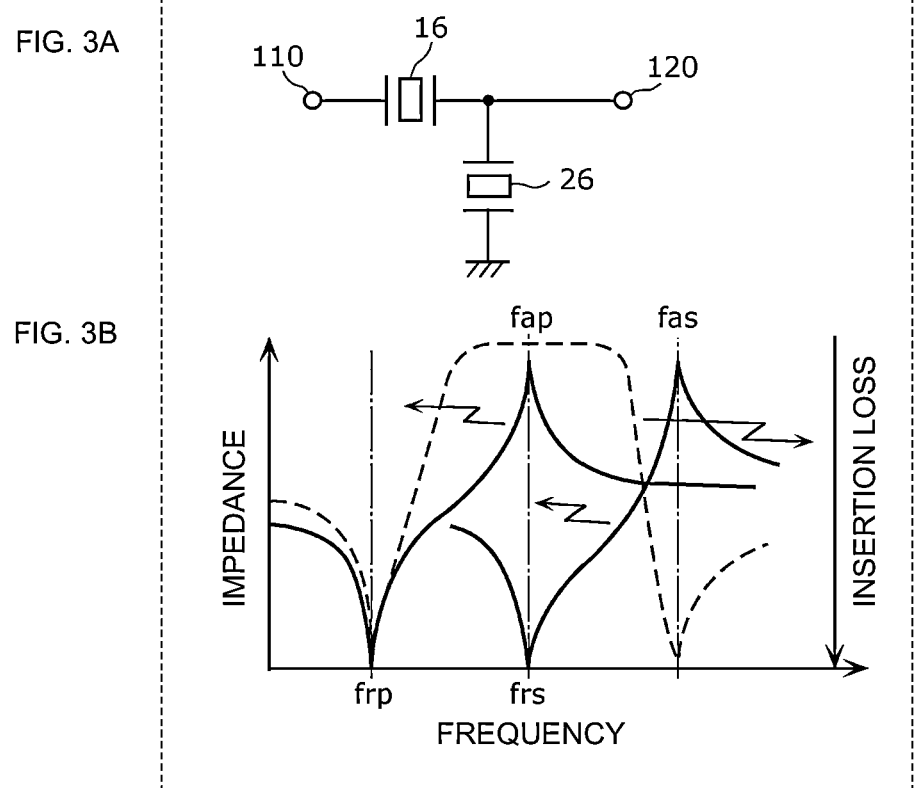
FIGS. 3A and 3B provide a circuit configuration diagram for explaining a basic operating principle of an acoustic wave ladder filter and a graph illustrating the frequency characteristic.

FIGS. 3A and 3B provide a circuit configuration diagram for explaining a basic operating principle of an acoustic wave ladder filter and a graph illustrating the frequency characteristic.

The acoustic wave filter illustrated in FIG. 3A is a basic ladder filter including one series arm resonator 16 and one parallel arm resonator 26. As illustrated in FIG. 3B, the parallel arm resonator 26 has a resonant frequency frp and an anti-resonant frequency fap (>frp) in the resonance characteristic. The series arm resonator 16 has a resonant frequency frs and an anti-resonant frequency fas (>frs>frp) in the resonance characteristic.

When a band pass filter includes a ladder acoustic wave resonator, the anti-resonant frequency fap of the parallel arm resonator 26 and the resonant frequency frs of the series arm resonator 16 are usually set to be close to each other. In this configuration, the range close to the resonant frequency frp in which the impedance of the parallel arm resonator 26 approaches zero is a lower-frequency-side stop band (attenuation band). Furthermore, as frequency increases in this configuration, the impedance of the parallel arm resonator 26 increases in the range close to the anti-resonant frequency fap while the impedance of the series arm resonator 16 approaches zero in the range close to the resonant frequency frs. As a result, the range close to the anti-resonant frequency fap to the resonant frequency frs is a band (pass band) in which signals pass through the signal path from the input-output terminal 110 to the input-output terminal 120. With this configuration, it is possible to form a pass band based on the electrode parameters of the acoustic wave resonator and the electromechanical coupling coefficient. As the frequency further increases to the range close to the anti-resonant frequency fas, the impedance of the series arm resonator 16 increases, and as a result, the range is a higher-frequency-side stop band (attenuation band).

In the acoustic wave filter on the operating principle described above, when a high frequency signal is inputted from the input-output terminal 110, potential difference occurs between the input-output terminal 110 and a reference terminal and the piezoelectric film thus strains, so that a surface acoustic wave occurs. Here, by setting the wavelength λ of the IDT electrode 54 and the wavelength of the pass band as almost the same wavelength, only high frequency signals of desired frequency components pass through the acoustic wave filter.

The number of resonator stages of parallel arm resonators and series arm resonators is optimized as appropriate in accordance with required specifications. Usually, in the case in which the acoustic wave filter includes a plurality of resonator stages, the anti-resonant frequency fap of a plurality of parallel arm resonators and the resonant frequency frs of a plurality of series arm resonators are positioned within or near the pass band. The resonant frequency frp of the parallel arm resonators is positioned in the lower-frequency-side stop band. The anti-resonant frequency fas of the series arm resonators is positioned in the higher-frequency-side stop band.

According to the operating principle of the acoustic wave ladder filter described above, the sharpness at the lower-frequency-side edge of the pass band in the bandpass characteristic greatly depends on the frequency difference (the resonance band width) between the resonant frequency frp and the anti-resonant frequency fap of one or more parallel arm resonators. Specifically, the narrower the resonance band width of one or more parallel arm resonators is, the steeper the straight line connecting the resonant frequency frp and the anti-resonant frequency fap is (to the horizontal line). Accordingly, the narrower the resonance band width of one or more parallel arm resonators is, the higher the sharpness at the lower-frequency-side edge of the pass band in the bandpass characteristic is. The sharpness at the higher-frequency-side edge of the pass band in the bandpass characteristic greatly depends on the frequency difference (the resonance band width) between the resonant frequency frs and the anti-resonant frequency fas of one or more series arm resonators. Specifically, the narrower the resonance band width of one or more series arm resonators is, the steeper the straight line connecting the resonant frequency frs and the anti-resonant frequency fas is (to the horizontal line). Accordingly, the narrower the resonance band width of one or more series arm resonators is, the higher the sharpness at the higher-frequency-side edge of the pass band in the bandpass characteristic is.

The insertion loss at the lower-frequency-side edge within the pass band greatly depends on the resonant frequency frp, resonance band width, and Q factor near the resonant frequency frp of one or more parallel arm resonators. The insertion loss at the higher-frequency-side edge within the pass band greatly depends on the anti-resonant frequency fas, resonance band width, and Q factor near the anti-resonant frequency fas of one or more series arm resonators.

According to the operating principle of the basic acoustic wave filter described above, the insertion losses at both edges of the pass band of the acoustic wave filter 1 of the present preferred embodiment are respectively determined by controlling the resonant frequency, anti-resonant frequency, resonance band width, and Q factor of the series arm resonators s1 and s2 and the parallel arm resonators p1 and p2.

The filter bandpass characteristic of the acoustic wave filter 1 according to the present preferred embodiment also greatly depends on frequency shifts of the resonance point and anti-resonance point with changes in temperature.

Figure 4:
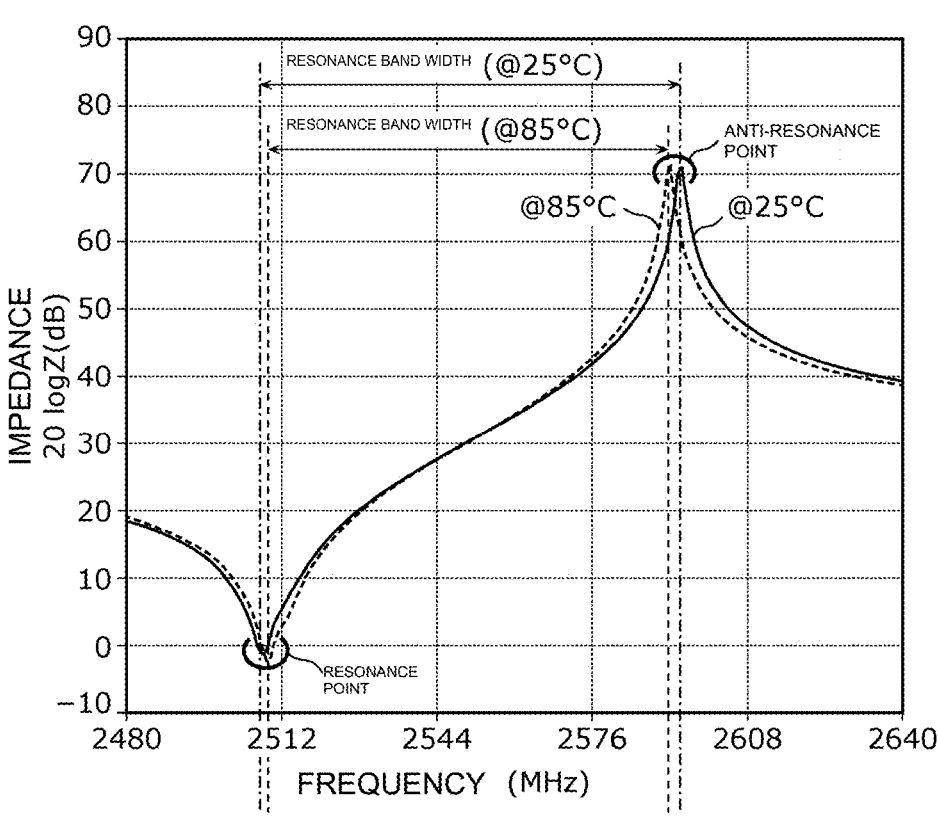
FIG. 4 is a graph illustrating the impedance characteristic of an acoustic wave resonator, indicating frequency-temperature change degree $\Delta$TCF.

1.4 Temperature Dependence of Resonance Characteristic of Acoustic Wave Resonator FIG. 4 is a graph illustrating the impedance characteristic of an acoustic wave resonator, indicating frequency-temperature change degree ΔTCF. More specifically, the graph indicates the impedance characteristic of an acoustic wave resonator having a structure formed by layering a high acoustic velocity film, a low acoustic velocity film, a piezoelectric film, and an IDT electrode in the order presented (hereinafter referred to as an acoustic velocity film layered structure), with respect to operating temperatures of about 25° C. and about 85° C.

When the operating temperature increases from about 25° C. to about 85° C., the amounts of frequency shifts at the resonance point and anti-resonance point of an acoustic wave resonator having the acoustic velocity film layered structure are smaller than the amounts of frequency shifts of an acoustic wave resonator having a structure in which an IDT electrode is formed on a piezoelectric substrate. Nevertheless, as illustrated in FIG. 4, when the operating temperature increases from about 25° C. to about 85° C., the resonance point of the acoustic wave resonator having the acoustic velocity film layered structure is shifted to the higher frequency side, and the anti-resonance point of the acoustic wave resonator is shifted to the lower frequency side.

Here, as an evaluation parameter indicating a change with temperature of the resonance band width (the differential frequency between the anti-resonant frequency and the resonant frequency), the frequency-temperature change degree ΔTCF is defined by Expression 1.

$$\Delta TCF = \text{the resonance band width}(@25° \text{ C.}) - \text{the reso-}\\ \text{nance band width}(@85° \text{ C.}) \qquad \text{(Expression 1)}$$

According to Expression 1, it can be understood that the higher the frequency-temperature change degree ΔTCF is, the narrower the resonance band width becomes with increases in temperature.

When the acoustic wave resonator having the acoustic velocity film layered structure is used as parallel arm resonators and series arm resonators to form an acoustic wave ladder filter, as the operating temperature rises, the resonance point of the parallel arm resonators shifts to the higher frequency side, and the anti-resonance point of the series arm resonators shifts to the lower frequency side. This means that as the operating temperature rises, the frequency-temperature change degree ΔTCF increases. Accordingly, the pass band width of the acoustic wave filter narrows with increases in the operating temperature. This can cause degradation of filter bandpass characteristics such as increases in the insertion loss and decreases in the electric power handling capability at the pass-band edges.

In this respect, the acoustic wave filter 1 according to the present preferred embodiment includes withdrawal electrodes among the IDT electrodes of the series arm resonators and parallel arm resonators so as to reduce or prevent degradation of filter characteristics due to changes in the operating temperature.

The following describes structure examples of withdrawal electrodes included in the acoustic wave resonator.

1.5 Electrode Finger Structure of Withdrawal Electrode

Figure 5A:
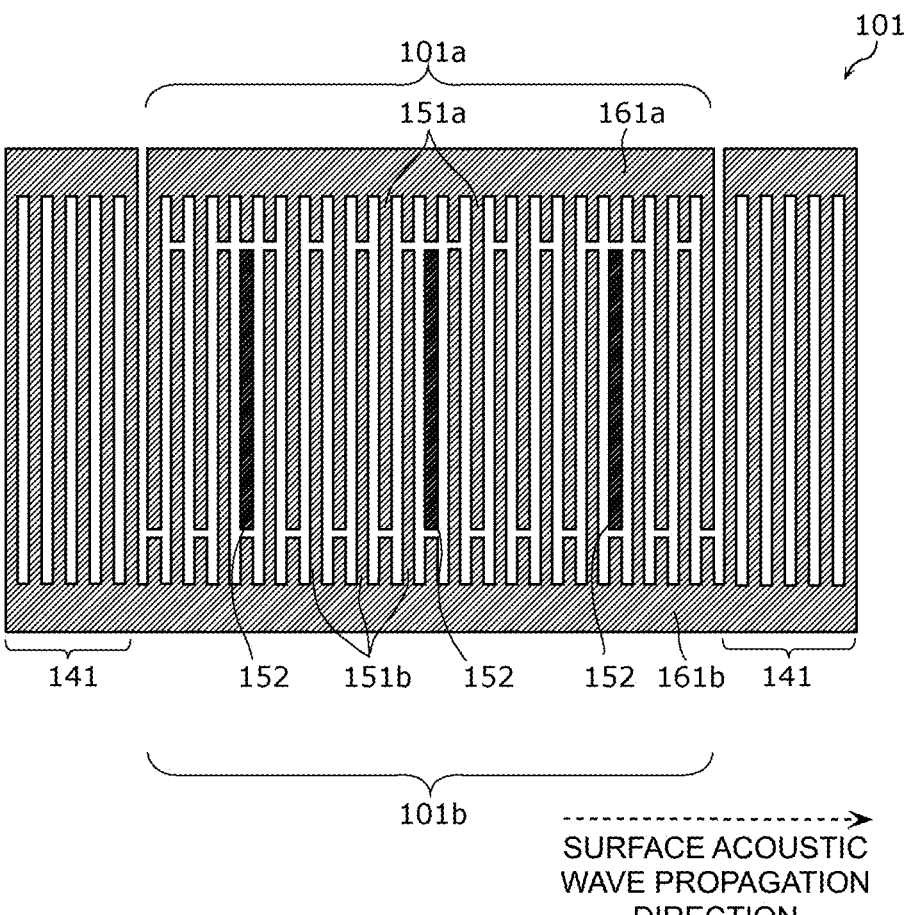
FIG. 5A is a schematic plan view illustrating a structure of an interdigital transducer (IDT) electrode including floating withdrawal electrodes in an acoustic wave filter.
Figure 5B:
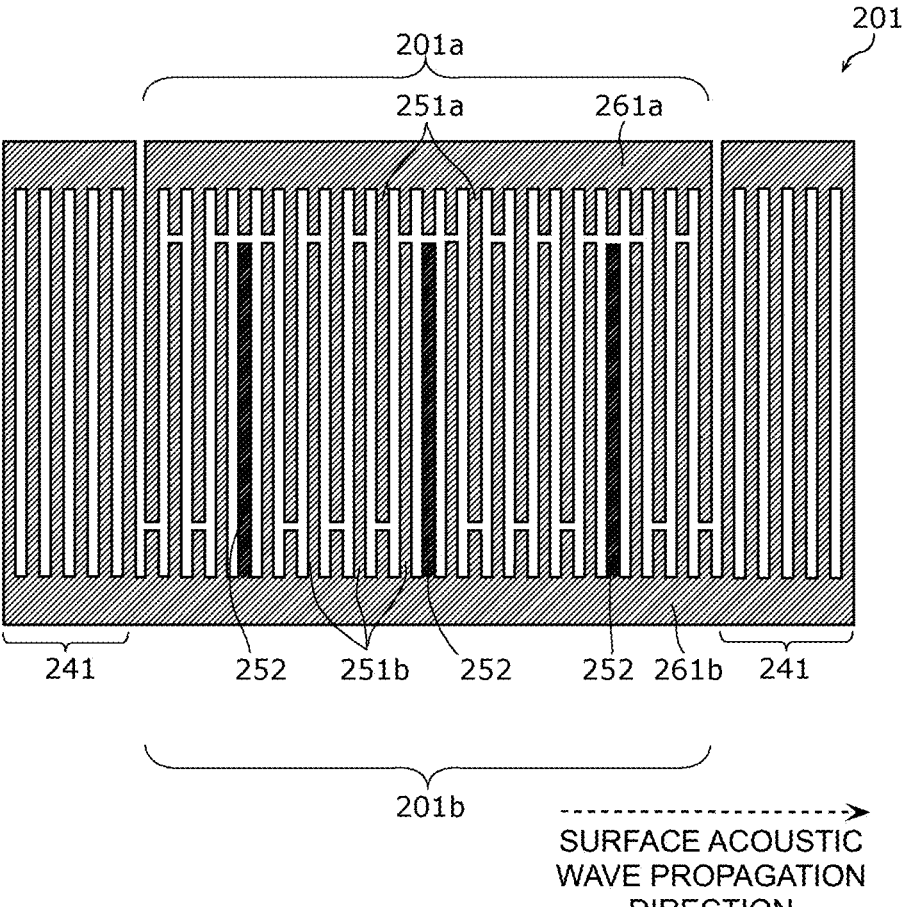
FIG. 5B is a schematic plan view illustrating a structure of an IDT electrode including polarity-inverting withdrawal electrodes in an acoustic wave filter.
Figure 5C:
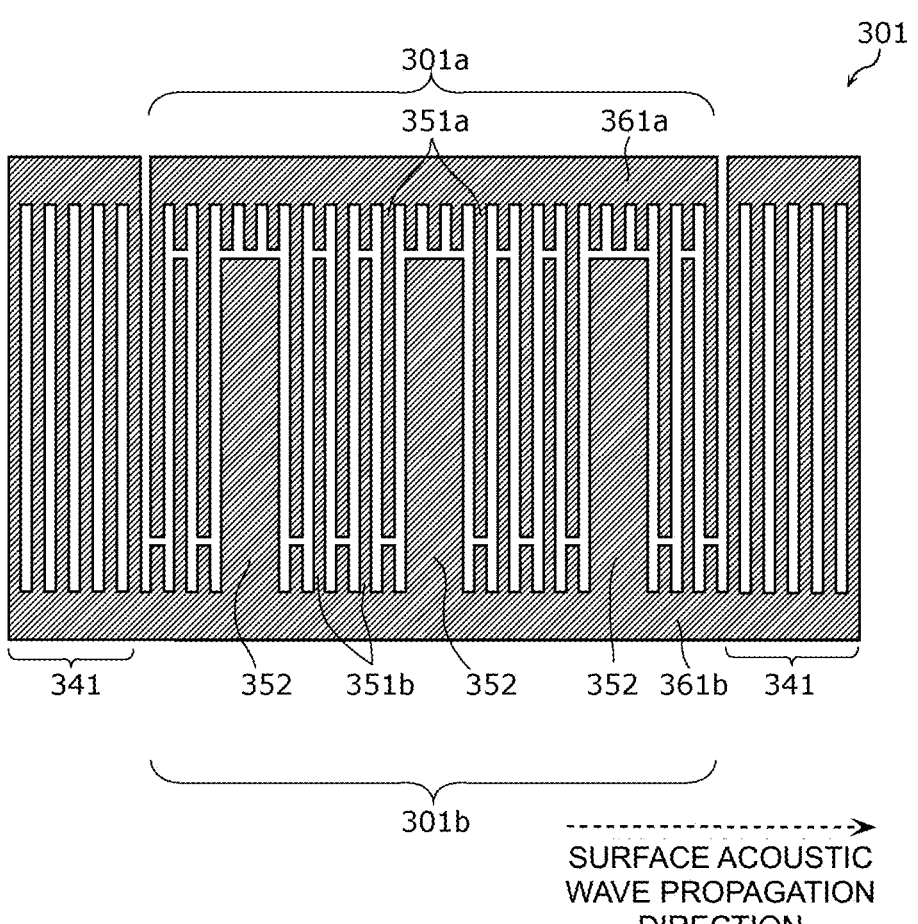
FIG. 5C is a schematic plan view illustrating a structure of an IDT electrode including filled withdrawal electrodes in an acoustic wave filter.

The following describes examples of electrode finger structures of IDT electrodes including withdrawal electrodes with reference to FIGS. 5A to 5C.

FIG. 5A is a schematic plan view illustrating a structure of an IDT electrode including floating withdrawal electrodes. FIG. 5B is a schematic plan view illustrating a structure of an IDT electrode including polarity-inverting withdrawal electrodes. FIG. 5C is a schematic plan view illustrating a structure of an IDT electrode including filled withdrawal electrodes.

FIG. 5A is a schematic plan view illustrating an IDT electrode structure of an acoustic wave resonator 101 including floating withdrawal electrodes. The acoustic wave resonator 101 illustrated in FIG. 5A is used only to explain a typical structure of floating withdrawal electrode, and the number of electrode fingers of an electrode, the length of electrode fingers, and other specifics are not limited to this example.

The acoustic wave resonator 101 includes the substrate 5 exhibiting piezoelectricity, and comb-shaped electrodes 101a and 101b and reflectors 141 that are formed on the substrate 5.

As illustrated in FIG. 5A, the comb-shaped electrode 101a includes a plurality of electrode fingers 151a parallel to each other and a busbar electrode 161a connecting one-side ends of the electrode fingers 151a to each other. The comb-shaped electrode 101b includes a plurality of electrode fingers 151b parallel to each other and a busbar electrode 161b connecting one-side ends of the electrode fingers 151b to each other. The electrode fingers 151a and 151b extend in a direction perpendicular to the surface acoustic wave propagation direction (X-axis direction). The comb-shaped electrodes 101a and 101b face each other in a state in which the electrode fingers 151a and 151b interdigitate with each other. This means that the IDT electrode of the acoustic wave resonator 101 includes the comb-shaped electrodes 101a and 101b in a pair.

The comb-shaped electrode 101a includes dummy electrodes facing the electrode fingers 151b in the longitudinal direction of the electrode fingers 151b, but the dummy electrodes are not necessarily provided. The comb-shaped electrode 101b includes dummy electrodes facing the electrode fingers 151a in the longitudinal direction of the electrode fingers 151a, but the dummy electrodes are not necessarily provided. The comb-shaped electrodes 101a and 101b may form a tilted IDT electrode in which the busbar electrodes extend in a direction tilted from the surface acoustic wave propagation direction or form a piston structure.

The reflectors 141 include a plurality of electrode fingers parallel to each other and busbar electrodes connecting the plurality of electrode fingers to each other. The reflectors 141 are positioned on both sides with respect to the pair of the comb-shaped electrodes 101a and 101b.

The IDT electrode including the comb-shaped electrodes 101a and 101b in a pair is, as illustrated in FIG. 2B, configured as a layered structure of the fixing layer 540 and the main electrode layer 542, but the structure of the IDT electrode is not limited to this layered structure.

Electrode fingers 152 are formed in the IDT electrode of the acoustic wave resonator 101 in a dispersed manner. The electrode fingers 152 are floating withdrawal electrodes that are not coupled to either of the busbar electrodes 161a and 161b and that are positioned in parallel to the electrode fingers 151a and 151b at the same pitch as the electrode fingers 151a and 151b. Some of the electrode fingers 151a and 151b are arranged between two adjacent electrode fingers 152. This means that the pitch of the electrode fingers 152 is larger than the pitch of the plurality of electrode fingers 151a and 151b.

The following specifies the withdrawal rate of the IDT electrode including floating withdrawal electrodes. When the number of the electrode fingers 152 in the IDT electrode is M and the number of pairs in the IDT electrode is N in the case in which the IDT electrode is formed by repeatedly disposing the electrode fingers 151a and 151b without providing the electrode fingers 152 in which one electrode finger 151a and one electrode finger 151b adjacent to each other are deemed as a pair, the withdrawal rate of the IDT electrode of the acoustic wave resonator 101 is defined by Expression 2 indicated below.

$$\text{Withdrawal rate} = M/\{2(N-M)+1\} \qquad \text{(Expression 2)}$$

FIG. 5B is a schematic plan view illustrating an IDT electrode structure of an acoustic wave resonator 201 including polarity-inverting withdrawal electrodes. The acoustic wave resonator 201 illustrated in FIG. 5B is used only to explain a typical structure of polarity-inverting withdrawal electrode, and the number of electrode fingers of an electrode, the length of electrode fingers, and other specifics are not limited to this example.

The acoustic wave resonator 201 includes the substrate 5 exhibiting piezoelectricity, comb-shaped electrodes 201a and 201b formed on the substrate 5, and reflectors 241.

As illustrated in FIG. 5B, the comb-shaped electrode 201a includes a plurality of electrode fingers 251a parallel to each other and a busbar electrode 261a connecting one-side ends of the electrode fingers 251a to each other. The comb-shaped electrode 201b includes a plurality of electrode fingers 251b parallel to each other and a busbar electrode 261b connecting one-side ends of the electrode fingers 251b to each other. The electrode fingers 251a and 251b extend in a direction perpendicular to the surface acoustic wave propagation direction (X-axis direction). The comb-shaped electrodes 201a and 201b face each other in a state in which the electrode fingers 251a and 251b interdigitate with each other. This means that the IDT electrode of the acoustic wave resonator 201 includes the comb-shaped electrodes 201a and 201b in a pair.

The comb-shaped electrode 201a includes dummy electrodes positioned in a longitudinal direction of the plurality of electrode fingers 251b to face the plurality of electrode fingers 251b, but the dummy electrodes are not necessarily provided. The comb-shaped electrode 201b includes dummy electrodes positioned in a longitudinal direction of the plurality of electrode fingers 251a to face the plurality of electrode fingers 251a, but the dummy electrodes are not necessarily provided. The comb-shaped electrodes 201a and 201b may form a tilted IDT electrode in which the busbar electrodes extend in a direction tilted from the surface acoustic wave propagation direction or form a piston structure.

The reflectors 241 include a plurality of electrode fingers parallel to each other and busbar electrodes connecting the plurality of electrode fingers to each other. The reflectors 241 are positioned on both sides of the pair of the comb-shaped electrodes 201a and 201b.

The IDT electrode including the comb-shaped electrodes 201a and 201b in a pair is, as illustrated in FIG. 2B, configured as a layered structure of the fixing layer 540 and the main electrode layer 542, but the structure of the IDT electrode is not limited to this layered structure.

Electrode fingers 252 are formed in the IDT electrode of the acoustic wave resonator 201 in a dispersed manner. The electrode fingers 252 are polarity-inverting withdrawal electrodes coupled to the same busbar electrode as the electrode fingers on both sides with respect to each electrode finger 252 among all the electrode fingers forming the comb-shaped electrodes 201a and 201b in a pair. The plurality of electrode fingers 251a and 251b are positioned between two adjacent electrode fingers 252. This means that the pitch of the electrode fingers 252 is greater than the pitch of the plurality of electrode fingers 251a and 251b.

The following specifies the withdrawal rate of the IDT electrode including polarity-inverting withdrawal electrodes. When the number of the electrode fingers 252 in the IDT electrode is M and the number of pairs in the IDT electrode is N in the case in which the IDT electrode is formed by repeatedly disposing the electrode fingers 251a and 251b without providing the electrode fingers 252 in which one electrode finger 251a and one electrode finger 251b adjacent to each other are deemed as a pair, the withdrawal rate of the IDT electrode of the acoustic wave resonator 201 is defined by Expression 2 indicated above.

FIG. 5C is a schematic plan view illustrating an IDT electrode structure of an acoustic wave resonator 301 including filled withdrawal electrodes. The acoustic wave resonator 301 illustrated in FIG. 5C is used only to explain a typical structure of filled withdrawal electrode, and the number of electrode fingers of an electrode, the length of electrode fingers, and other specifics are not limited to this example.

The acoustic wave resonator 301 includes the substrate 5 exhibiting piezoelectricity, comb-shaped electrodes 301a and 301b formed on the substrate 5, and reflectors 341.

As illustrated in FIG. 5C, the comb-shaped electrode 301a includes a plurality of electrode fingers 351a parallel to each other and a busbar electrode 361a connecting one-side ends of the electrode fingers 351a to each other. The comb-shaped electrode 301b includes a plurality of electrode fingers 351b parallel to each other and a busbar electrode 361b connecting one-side ends of the electrode fingers 351b to each other. The electrode fingers 351a and 351b extend in a direction perpendicular to the surface acoustic wave propagation direction (X-axis direction). The comb-shaped electrodes 301a and 301b face each other in a state in which the electrode fingers 351a and 351b interdigitate with each other. This means that the IDT electrode of the acoustic wave resonator 301 includes the comb-shaped electrodes 301a and 301b in a pair.

The comb-shaped electrode 301a includes dummy electrodes positioned in a longitudinal direction of the plurality of electrode fingers 351b to face the plurality of electrode fingers 351b, but the dummy electrodes are not necessarily provided. The comb-shaped electrode 301b includes dummy electrodes positioned in a longitudinal direction of the plurality of electrode fingers 351a to face the plurality of electrode fingers 351a, but the dummy electrodes are not necessarily provided. The comb-shaped electrodes 301a and 301b may form a tilted IDT electrode in which the busbar electrodes extend in a direction tilted from the surface acoustic wave propagation direction or form a piston structure.

The reflectors 341 include a plurality of electrode fingers parallel to each other and busbar electrodes connecting the plurality of electrode fingers to each other. The reflectors 341 are positioned on both sides of the pair of the comb-shaped electrodes 301a and 301b.

The IDT electrode including the comb-shaped electrodes 301a and 301b in a pair is, as illustrated in FIG. 2B, configured as a layered structure of the fixing layer 540 and the main electrode layer 542, but the structure of the IDT electrode is not limited to this layered structure.

Electrode fingers 352 are formed in the IDT electrode of the acoustic wave resonator 301 in a dispersed manner. The electrode fingers 352 are filled withdrawal electrodes. The electrode finger width of the filled withdrawal electrodes is twice or more the average electrode finger width of the electrode fingers except the electrode fingers 352, which is the widest electrode finger width in the IDT electrode of the acoustic wave resonator 301. In other words, the electrode fingers 352 are filled withdrawal electrodes in which one electrode finger is formed by joining adjacent electrode fingers 351a and 351b and the spaces between the adjacent electrode fingers 351a and 351b, the one electrode finger is coupled to the busbar electrode 361a or 361b, and the electrode finger width of the one electrode finger is wider than the plurality of electrode fingers 351a and 351b. The plurality of electrode fingers 351a and 351b are positioned between two adjacent electrode fingers 352. This means that the pitch of the electrode fingers 352 is greater than the pitch of the plurality of electrode fingers 351a and 351b.

The following specifies the withdrawal rate of the IDT electrode including filled withdrawal electrodes. When the number of the electrode fingers 352 in the IDT electrode is M and the number of pairs in the IDT electrode is N in the case in which the IDT electrode is formed by repeatedly disposing the electrode fingers 351a and 351b without providing the electrode fingers 352 in which one electrode finger 351a and one electrode finger 351b adjacent to each other are deemed as a pair, the withdrawal rate of the IDT electrode of the acoustic wave resonator 301 is defined by Expression 2 indicated above.

In an acoustic wave ladder filter including one or more series arm resonators and one or more parallel arm resonators, withdrawal electrodes are used in the IDT electrode of each resonator for the purpose of increasing the sharpness at the pass-band edges and reducing the insertion losses at the edges within the pass band (reducing drops at the shoulders of the pass band).

Of the acoustic wave filter 1 according to the present preferred embodiment, the sharpness at the higher-frequency-side edge of the pass band is greatly affected by the resonance characteristic near the anti-resonant frequency fas of the series arm resonators s1 and s2. When withdrawal electrodes are used in the IDT electrodes of the series arm resonators s1 and s2 for the purpose of improving the sharpness at the pass-band edges, the resonance band width and the resonance Q factor at the resonance point and anti-resonance point change depending on the electrode finger structure of the withdrawal electrodes. As the withdrawal rate increases, the resonance band width (fractional band width) of both of the floating withdrawal electrode and the polarity-inverting withdrawal electrode narrows.

Figure 6A:
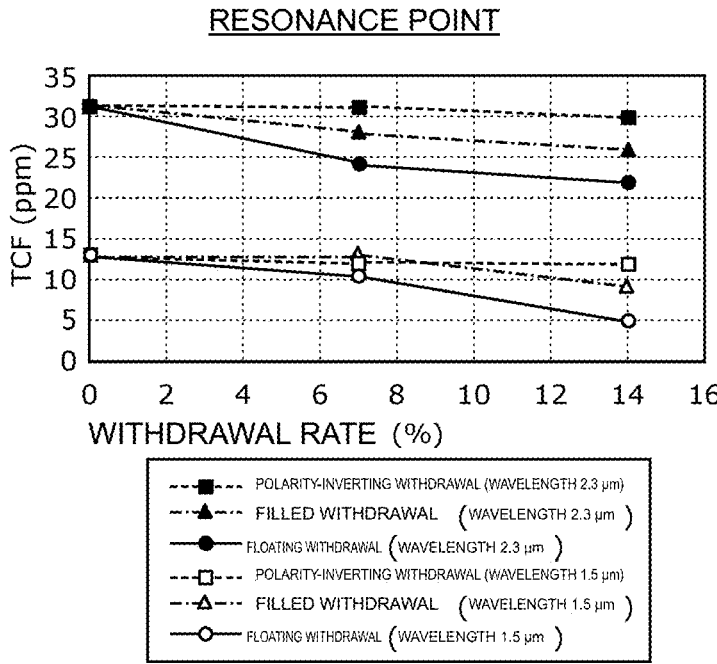
FIG. 6A is a graph illustrating plots of temperature coefficient of frequency TCF versus withdrawal rate at the resonance point of the acoustic wave resonator according to the first preferred embodiment of the present invention.
Figure 6B:
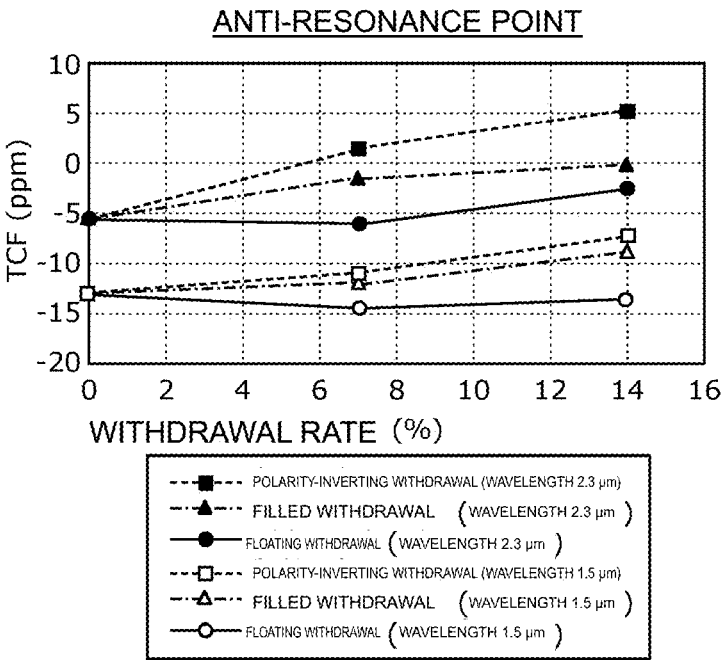
FIG. 6B is a graph illustrating plots of temperature coefficient of frequency TCF versus withdrawal rate at the anti-resonance point of the acoustic wave resonator according to the first preferred embodiment of the present invention.

1.6 Resonance Characteristic of Acoustic Wave Resonator Including Withdrawal Electrode FIG. 6A is a graph illustrating plots of temperature coefficient of frequency TCF versus withdrawal rate at the resonance point of the acoustic wave resonator according to the first preferred embodiment. FIG. 6B is a graph illustrating plots of temperature coefficient of frequency TCF versus withdrawal rate at the anti-resonance point of the acoustic wave resonator according to the first preferred embodiment. Specifically, FIG. 6A illustrates plots of temperature coefficient of frequency TCF versus withdrawal rate at the resonance point (resonant frequency) of the acoustic wave resonator having the acoustic velocity film layered structure. FIG. 6B illustrates plots of temperature coefficient of frequency TCF versus withdrawal rate at the anti-resonance point (anti-resonant frequency) of the acoustic wave resonator having the acoustic velocity film layered structure.

Major parameters of the acoustic wave resonator exhibiting the characteristics illustrated in FIGS. 6A and 6B are indicated in Table 1.

TABLE 1

| Film thickness of main electrode layer 542 (nm) | 130 |
| Electrode finger structure | Piston structure |
| Wavelength λ (μm) | 1-3 |
| Film thickness of piezoelectric film 53 (nm) | 600 |
| Film thickness of low acoustic velocity film 52 (nm) | 673 |
| Film thickness of high acoustic velocity support substrate 51 (high acoustic velocity film) (nm) | 900 |

As illustrated in FIG. 6A, at the resonance point of the acoustic wave resonator having the acoustic velocity film layered structure, the acoustic wave resonator having the IDT electrode including floating withdrawal electrodes indicates minimum temperature coefficients of frequency TCF, and the temperature coefficients of frequency TCF are positive values. As the withdrawal rate increases, the temperature coefficient of frequency TCF decreases. According to this, it is desirable that at least one of the parallel arm resonators p1 and p2 of the acoustic wave filter 1 have the IDT electrode including floating withdrawal electrodes.

This configuration reduces the amount of shift of the resonance point of at least one of the parallel arm resonators p1 and p2 to the higher frequency side with rises in temperature. As a result, it is possible to reduce or prevent increases in the insertion loss at the lower-frequency-side edge of the pass band of the acoustic wave filter 1 with rises in temperature.

By contrast, as illustrated in FIG. 6B, at the anti-resonance point of the acoustic wave resonator having the acoustic velocity film layered structure, the acoustic wave resonator having the IDT electrode including polarity-inverting withdrawal electrodes indicates maximum temperature coefficients of frequency TCF. As the withdrawal rate increases, the temperature coefficient of frequency TCF increases. When the withdrawal rate is about 7% or greater, the temperature coefficient of frequency TCF of the IDT electrode including polarity-inverting withdrawal electrodes (wavelength: about 2.3 μm) indicates positive values. According to this, it is desirable that at least one of the series arm resonators s1 and s2 of the acoustic wave filter 1 have the IDT electrode including polarity-inverting withdrawal electrodes. This configuration reduces the amount of shift of the anti-resonance point of at least one of the series arm resonators s1 and s2 to the lower frequency side with rises in temperature. As a result, it is possible to reduce or prevent increases in the insertion loss at the higher-frequency-side edge of the pass band of the acoustic wave filter 1 with rises in temperature.

When the resonance band width in Expression 1 is the pass band width of the acoustic wave filter 1, ΔTCF is also expressed as Expression 3.

$$\Delta TCF = \text{the frequency difference between the anti-resonant frequency of the series arm resonator and the resonant frequency of the parallel arm resonator}(@25° \text{ C.}) - \text{the frequency difference between the anti-resonant frequency of the series arm resonator and the resonant frequency of the parallel arm resonator}(@85° \text{ C.}) \qquad \text{(Expression 3)}$$

According to Expression 3, ΔTCF of the acoustic wave filter 1 is decreased by configuring the acoustic wave filter 1 such that at least one of the parallel arm resonators p1 and p2 has the IDT electrode including floating withdrawal electrodes and at least one of the series arm resonators s1 and s2 has the IDT electrode including polarity-inverting withdrawal electrodes; ΔTCF of the acoustic wave filter 1 is further decreased by increasing the withdrawal rate.

As a result, it is possible to reduce or prevent increases in the insertion loss at the pass-band edges of the acoustic wave filter 1 with rises in temperature and consequently to reduce or prevent degradation of filter bandpass characteristics such as decreases in the electric power handling capability at the pass-band edges.

It is desirable that the parallel arm resonator having the IDT electrode including floating withdrawal electrodes be a parallel arm resonator (a first parallel arm resonator) having a higher resonant frequency between the parallel arm resonators p1 and p2. The first parallel arm resonator has the greatest influence on the sharpness of the attenuation slope on the lower frequency side of the pass band of the acoustic wave filter 1. Hence, when the first parallel arm resonator has the IDT electrode including floating withdrawal electrodes, it is possible to effectively reduce or prevent increases in the insertion loss at the lower-frequency-side edge of the pass band of the acoustic wave filter 1 with rises in temperature.

It is also desirable that the series arm resonator having the IDT electrode including polarity-inverting withdrawal electrodes be a series arm resonator (a first series arm resonator) having a lower anti-resonant frequency between the series arm resonators s1 and s2. The first series arm resonator has the greatest influence on the sharpness of the attenuation slope on the higher frequency side of the pass band of the acoustic wave filter 1. Hence, when the first series arm resonator has the IDT electrode including polarity-inverting withdrawal electrodes, it is possible to effectively reduce or prevent increases in the insertion loss at the higher-frequency-side edge of the pass band of the acoustic wave filter 1 with rises in temperature.

It is also desirable that the series arm resonator having the IDT electrode including polarity-inverting withdrawal electrodes have a wavelength λ of about 2.3 μm or greater and a withdrawal rate of about 7% or greater, for example.

With this configuration, as illustrated in FIG. 6B, the temperature coefficient of frequency at the anti-resonance point of the series arm resonator indicates positive values, and thus, the anti-resonance point of the series arm resonator shifts to the higher frequency side with rises in the operating temperature. As a result, the acoustic wave filter 1 indicates the tendency that the insertion loss at the higher-frequency-side edge of the pass band of the acoustic wave filter 1 decreases rather than increases with rises in the operating temperature. This enhances the electric power handling capability near the higher-frequency-side edge of the pass band.

Figures 7A, 7B:
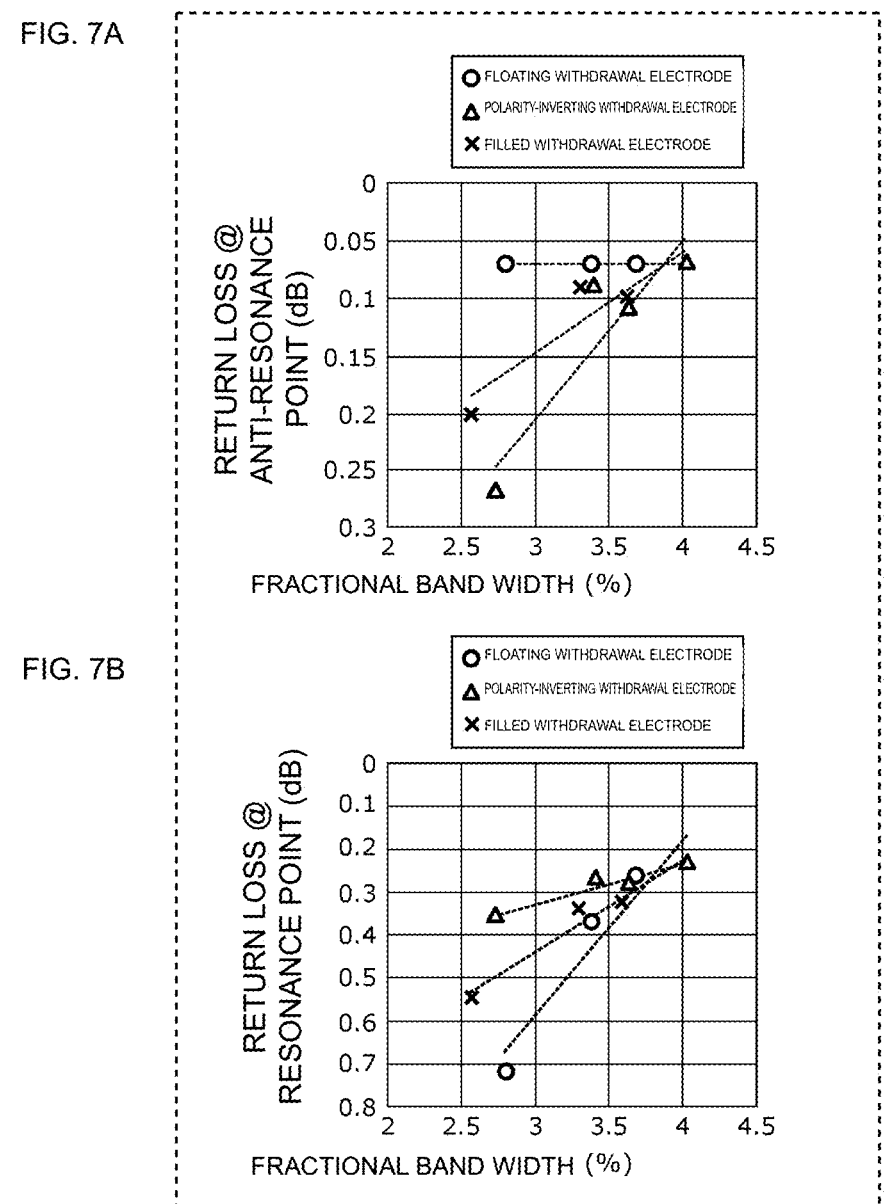
FIGS. 7A and 7B provide graphs illustrating the return loss with changes in the fractional band width of the acoustic wave resonator at the resonance point and the anti-resonance point.

1.7 Reflection Characteristic of Acoustic Wave Resonator Including Withdrawal Electrode FIGS. 7A and 7B provide graphs illustrating the return loss with changes in the fractional band width of the acoustic wave resonator at the resonance point (FIG. 7A) and the anti-resonance point (FIG. 7B). The vertical axis in FIG. 7A indicates the return loss of the acoustic wave resonator at the anti-resonance point. The vertical axis in FIG. 7B indicates the return loss of the acoustic wave resonator at the resonance point. The horizontal axes in FIGS. 7A and 7B indicate fractional band width (resonance band width divided by resonant frequency), which is convertible into withdrawal rate. In this case, the larger the fractional band width is, the smaller the withdrawal rate is.

According to FIG. 7A, as the fractional band width decreases (as the withdrawal rate increases), the return loss of the acoustic wave resonator including polarity-inverting withdrawal electrodes at the anti-resonance point increases. By contrast, the return loss of the acoustic wave resonator including floating withdrawal electrodes at the anti-resonance point does not change with decreases in the fractional band width (increases in the withdrawal rate).

According to FIG. 7B, as the fractional band width decreases (as the withdrawal rate increases), the return loss of the acoustic wave resonator including floating withdrawal electrodes at the resonance point increases.

Second Preferred Embodiment

The acoustic wave filter 1 according to the first preferred embodiment is usable in a multiplexer. In the present preferred embodiment, a multiplexer including the acoustic wave filter 1 will be described.

Figure 8:
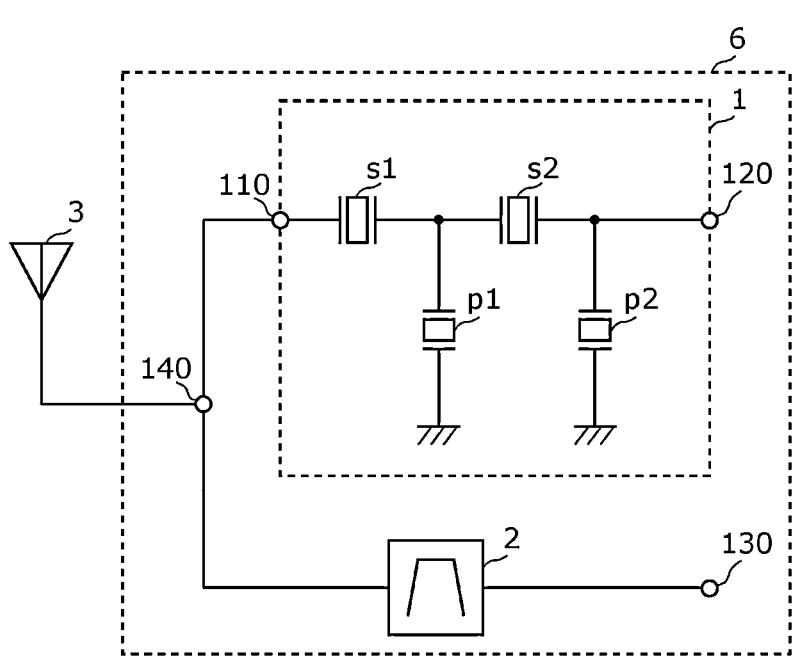
FIG. 8 is a circuit configuration diagram of a multiplexer according to a second preferred embodiment of the present invention.

FIG. 8 is a circuit configuration diagram of a multiplexer 6 according to a second preferred embodiment. As illustrated in the drawing, the multiplexer 6 includes a common terminal 140, the acoustic wave filter 1, a filter 2, and an input-output terminal 130.

The common terminal 140 is coupled to, for example, an antenna 3. The acoustic wave filter 1 is coupled to the common terminal 140.

The filter 2 is an example of a first filter. The filter 2 includes a third input-output terminal and a fourth input-output terminal. The pass band of the filter 2 is different from the pass band of the acoustic wave filter 1. The third input-output terminal is coupled to the common terminal 140.

With this configuration, it is possible to provide the multiplexer 6 in which increases in the insertion loss at the pass-band edges of the acoustic wave filter 1 with rises in temperature are reduced or prevented, and degradation of filter bandpass characteristics such as decreases in the electric power handling capability at the pass-band edges is consequently reduced or prevented.

According to FIGS. 7A and 7B, it is desirable that in the acoustic wave filter 1 the series arm resonator including polarity-inverting withdrawal electrodes be not directly coupled to the input-output terminal 110. It is also desirable that the parallel arm resonator including floating withdrawal electrodes be not directly coupled to the input-output terminal 110.

Among the acoustic wave resonators of the acoustic wave filter 1, the closer an acoustic wave resonator is to the input-output terminal 110, the more easily the spurious waves occurring at the acoustic wave resonator flow out of the acoustic wave filter 1. In this respect, the configuration described above reduces the possibility that spurious waves from the acoustic wave filter 1 flow into an external circuit coupled to the input-output terminal 110, so that degradation of radio-frequency characteristics of the external circuit is reduced or prevented.

As a result, when the pass band of the filter 2 includes spurious waves caused by withdrawal electrodes of the acoustic wave resonator of the acoustic wave filter 1, the flow of the spurious waves from the acoustic wave filter 1 to the filter 2 is hindered. It is thus possible to provide the multiplexer 6 in which degradation of insertion loss within the pass band in the filter 2 is reduced or prevented.

It is also desirable that in the acoustic wave filter 1 the series arm resonator including polarity-inverting withdrawal electrodes be not directly coupled to the input-output terminal 120. It is also desirable that the parallel arm resonator including floating withdrawal electrodes be not directly coupled to the input-output terminal 120.

With this configuration, when the acoustic wave filter 1 is a transmit filter, in a resonator close to the input-output terminal 120, which is required to have the highest electric power handling characteristic, degradation of the electric power handling capability due to withdrawal electrodes of the acoustic wave resonator does not occur. It is thus possible to provide the multiplexer 6 that is usable with higher electric power handling capability.

The multiplexer 6 includes two filters (the acoustic wave filter 1 and the filter 2) coupled to the common terminal 140, but the number of filters coupled to the common terminal 140 is not limited to two and may be three or more.

Circuit elements such as an inductor, a capacitor, a switch, a divider, and a circulator may be inserted between the common terminal 140 and the acoustic wave filter 1 and between the common terminal 140 and the filter 2.

Effects

The acoustic wave filter 1 according to the first preferred embodiment includes one or more series arm resonators provided in a path connecting the input-output terminals 110 and 120 and one or more parallel arm resonators each provided between a node in the path and the ground. The one or more series arm resonators and the one or more parallel arm resonators include an acoustic wave resonator having an IDT electrode formed on the substrate 5 exhibiting piezoelectricity. The substrate 5 includes the piezoelectric film 53 having one surface having the IDT electrode, the high acoustic velocity support substrate 51, the acoustic velocity of a bulk wave propagating in the high acoustic velocity support substrate 51 being higher than the acoustic velocity of an acoustic wave propagating along the piezoelectric film 53, and the high acoustic velocity support substrate 51. The IDT electrode includes a pair of comb-shaped electrodes each including a plurality of electrode fingers and a busbar electrode. A floating withdrawal electrode is defined as an electrode finger that is not coupled to either busbar electrode of the pair of comb-shaped electrodes among the plurality of electrode fingers. A polarity-inverting withdrawal electrode is defined as an electrode finger that is coupled to the same busbar electrode as adjacent electrode fingers on both sides with respect to the electrode finger among all the electrode fingers of the pair of comb-shaped electrodes. At least one of the one or more series arm resonators includes the IDT electrode including a polarity-inverting withdrawal electrode. At least one of the one or more parallel arm resonators includes the IDT electrode including a floating withdrawal electrode.

This configuration reduces the amount of shift of the resonance point of at least one of the one or more parallel arm resonators to the higher frequency side with rises in temperature. This configuration reduces the amount of shift of the anti-resonance point of at least one of the one or more series arm resonators to the lower frequency side with rises in temperature. As a result, it is possible to reduce or prevent increases in the insertion loss at the pass-band edges of the acoustic wave filter 1 with rises in temperature and consequently to reduce or prevent degradation of filter bandpass characteristics such as decreases in the electric power handling capability at the pass-band edges.

It may be possible that in the acoustic wave filter 1, a parallel arm resonator having a highest resonant frequency among the one or more parallel arm resonators is a first parallel arm resonator, and the first parallel arm resonator includes the IDT electrode including the floating withdrawal electrode.

The first parallel arm resonator has the greatest influence on the sharpness of the attenuation slope on the lower frequency side of the pass band of the acoustic wave filter 1. Hence, when the first parallel arm resonator has the IDT electrode including floating withdrawal electrodes, it is possible to effectively reduce or prevent increases in the insertion loss at the lower-frequency-side edge of the pass band of the acoustic wave filter 1 with rises in temperature.

It may be possible that in the acoustic wave filter 1, a series arm resonator having a lowest anti-resonant frequency among the one or more series arm resonators is a first series arm resonator including the IDT electrode including the polarity-inverting withdrawal electrode.

The first series arm resonator has the greatest influence on the sharpness of the attenuation slope on the higher frequency side of the pass band of the acoustic wave filter 1. Hence, when the first series arm resonator has the IDT electrode including polarity-inverting withdrawal electrodes, it is possible to effectively reduce or prevent increases in the insertion loss at the higher-frequency-side edge of the pass band of the acoustic wave filter 1 with rises in temperature.

It may be possible that in the acoustic wave filter 1, the at least one series arm resonator of the one or more series arm resonators including the IDT electrode including the polarity-inverting withdrawal electrode has a wavelength of about 2.3 μm or longer and a withdrawal rate of about 7% or larger, for example.

With this configuration, the temperature coefficient of frequency at the anti-resonance point of the series arm resonator indicates positive values, and thus, the anti-resonance point of the series arm resonator shifts to the higher frequency side with rises in the operating temperature. As a result, the acoustic wave filter 1 indicates the tendency that the insertion loss at the higher-frequency-side edge of the pass band of the acoustic wave filter 1 decreases rather than increases. This enhances the electric power handling capability near the higher-frequency-side edge of the pass band.

It may be possible that in the acoustic wave filter 1, among the one or more parallel arm resonators, a parallel arm resonator including the floating withdrawal electrode is not directly coupled to at least one of the input-output terminals 110 and 120.

The configuration described above reduces the possibility that spurious waves from the acoustic wave filter 1 flow into an external circuit coupled to the input-output terminal 110 or 120, so that degradation of radio-frequency characteristics of the external circuit is reduced or prevented.

It may be possible that in the acoustic wave filter 1, among the one or more series arm resonators, a series arm resonator including the polarity-inverting withdrawal electrode is not directly coupled to at least one of the input-output terminals 110 and 120.

The configuration described above reduces the possibility that spurious waves from the acoustic wave filter 1 flow into an external circuit coupled to the input-output terminal 110 or 120, so that degradation of radio-frequency characteristics of the external circuit is reduced or prevented.

It may be possible that in the acoustic wave filter 1, the substrate 5 further includes the low acoustic velocity film 52 provided between the high acoustic velocity support substrate 51 and the piezoelectric film 53, and the acoustic velocity of a bulk wave propagating in the low acoustic velocity film 52 is lower than the acoustic velocity of a bulk wave propagating in the piezoelectric film 53.

It may be possible that in the acoustic wave filter 1, the substrate 5 further includes an acoustic impedance layer provided between the high acoustic velocity support substrate 51 and the piezoelectric film 53, and the acoustic impedance layer includes a low acoustic impedance layer having a relatively low acoustic impedance and a high acoustic impedance layer having a relatively high acoustic impedance that are alternately layered.

The multiplexer 6 according to the second preferred embodiment includes the common terminal 140, the acoustic wave filter 1, and the filter 2 including a third input-output terminal and a fourth input-output terminal, having a pass band different from the pass band of the acoustic wave filter 1. The common terminal 140 is coupled to the input-output terminal 110 and the third input-output terminal.

With this configuration, it is possible to provide the multiplexer 6 in which increases in the insertion loss at the pass-band edges of the acoustic wave filter 1 with rises in temperature are reduced or prevented, and decreases in the electric power handling capability at the pass-band edges are consequently reduced or prevented.

Other Modifications

The acoustic wave filter 1 and the multiplexer 6 have been described with reference to preferred embodiments, but the acoustic wave filters and multiplexers of the present invention are not limited to the preferred embodiments described above. The present invention also embraces other preferred embodiments implemented as any combination of the elements or features of the preferred embodiments, other modified examples obtained by making various modifications to the preferred embodiments without departing from the scope of the present invention, and various hardware devices including the acoustic wave filter 1 and the multiplexer 6 of the preferred embodiments of the present invention.

The acoustic wave resonator of the acoustic wave filter 1 according to a preferred embodiment of the present invention is, for example, a surface acoustic wave (SAW) resonator that generates surface waves and boundary waves.

Preferred embodiments of the present invention and modifications or combinations thereof are usable, as an acoustic wave filter with excellent sharpness that can support multiband and multimode frequency standards, for a wide variety of communication devices such as mobile phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:

a first input-output terminal and a second input-output terminal;

one or more series arm resonators provided in a path connecting the first input-output terminal and the second input-output terminal; and one or more parallel arm resonators each provided between a node in the path and ground; wherein each of the one or more series arm resonators and the one or more parallel arm resonators includes an acoustic wave resonator including a substrate exhibiting piezoelectricity and an interdigital transducer (IDT) electrode on the substrate;

the substrate includes:

a piezoelectric film with one surface including the IDT electrode; and a high acoustic velocity support substrate, an acoustic velocity of a bulk wave propagating in the high acoustic velocity support substrate being higher than an acoustic velocity of an acoustic wave propagating along the piezoelectric film;

the IDT electrode includes a pair of comb-shaped electrodes each including a plurality of electrode fingers that extend in a direction crossing an acoustic wave propagation direction and that are arranged in parallel to each other, and a busbar electrode that connects one-side ends of electrode fingers of the plurality of electrode fingers to each other; and when a floating withdrawal electrode is defined as an electrode finger that is not coupled to either busbar electrode of the pair of comb-shaped electrodes among the plurality of electrode fingers and, in a portion of the IDT electrode in which the plurality of electrode fingers of each of the pair of comb-shaped electrodes face each other in the acoustic wave propagation direction, a polarity-inverting withdrawal electrode is defined as an electrode finger that is coupled to the same busbar electrode as directly adjacent electrode fingers on both sides with respect to the electrode finger among the plurality of electrode fingers:

at least one of the one or more series arm resonators includes the IDT electrode including the polarity-inverting withdrawal electrode; and at least one of the one or more parallel arm resonators includes the IDT electrode including the floating withdrawal electrode.

2. The acoustic wave filter according to claim 1, wherein a parallel arm resonator having a highest resonant frequency among the one or more parallel arm resonators is a first parallel arm resonator, and the first parallel arm resonator includes the IDT electrode including the floating withdrawal electrode.

3. The acoustic wave filter according to claim 1, wherein a series arm resonator having a lowest anti-resonant frequency among the one or more series arm resonators is a first series arm resonator including the IDT electrode including the polarity-inverting withdrawal electrode.

4. The acoustic wave filter according to claim 1, wherein the at least one series arm resonator of the one or more series arm resonators including the IDT electrode including the polarity-inverting withdrawal electrode has a wavelength of about 2.3 μm or longer and a withdrawal rate of about 7% or larger.

5. The acoustic wave filter according to claim 1, wherein among the one or more parallel arm resonators, a parallel arm resonator including the floating withdrawal electrode is not directly coupled to at least one of the first input-output terminal and the second input-output terminal.

6. The acoustic wave filter according to claim 1, wherein among the one or more series arm resonators, a series arm resonator including the polarity-inverting withdrawal electrode is not directly coupled to at least one of the first input-output terminal and the second input-output terminal.

7. The acoustic wave filter according to claim 1, wherein the substrate further includes a low acoustic velocity film between the high acoustic velocity support substrate and the piezoelectric film, an acoustic velocity of a bulk wave propagating in the low acoustic velocity film being lower than an acoustic velocity of a bulk wave propagating in the piezoelectric film.

8. The acoustic wave filter according to claim 1, wherein the substrate further includes an acoustic impedance layer between the high acoustic velocity support substrate and the piezoelectric film, the acoustic impedance layer including a low acoustic impedance layer having a relatively low acoustic impedance and a high acoustic impedance layer having a relatively high acoustic impedance that are alternately layered.

9. The acoustic wave filter according to claim 1, wherein an inductor, a capacitor, or a longitudinally coupled resonator is inserted among the one or more series arm resonators, the one or more parallel arm resonators, the first and second input-output terminals, and the ground.

10. The acoustic wave filter according to claim 1, wherein the acoustic wave filter is a band-pass ladder filter.

11. A multiplexer comprising:

a common terminal;

the acustic wave filter according to claim 1; and a first filter including a third input-output terminal and a fourth input-output terminal, a pass band of the first filter being different from a pass band of the acoustic wave filter; wherein the common terminal is coupled to the first input-output terminal and the third input-output terminal.

12. The multiplexer according to claim 11, wherein a parallel arm resonator having a highest resonant frequency among the one or more parallel arm resonators is a first parallel arm resonator, and the first parallel arm resonator includes the IDT electrode including the floating withdrawal electrode.

13. The multiplexer according to claim 11, wherein a series arm resonator having a lowest anti-resonant frequency among the one or more series arm resonators is a first series arm resonator including the IDT electrode including the polarity-inverting withdrawal electrode.

14. The multiplexer according to claim 11, wherein the at least one series arm resonator of the one or more series arm resonators including the IDT electrode including the polarity-inverting withdrawal electrode has a wavelength of about 2.3 $\mu$m or longer and a withdrawal rate of about 7% or larger.

15. The multiplexer according to claim 11, wherein among the one or more parallel arm resonators, a parallel arm resonator including the floating withdrawal electrode is not directly coupled to at least one of the first input-output terminal and the second input-output terminal.

16. The multiplexer according to claim 11, wherein among the one or more series arm resonators, a series arm resonator including the polarity-inverting withdrawal electrode is not directly coupled to at least one of the first input-output terminal and the second input-output terminal.

17. The multiplexer according to claim 11, wherein the substrate further includes a low acoustic velocity film between the high acoustic velocity support substrate and the piezoelectric film, an acoustic velocity of a bulk wave propagating in the low acoustic velocity film being lower than an acoustic velocity of a bulk wave propagating in the piezoelectric film.

18. The multiplexer according to claim 11, wherein the substrate further includes an acoustic impedance layer between the high acoustic velocity support substrate and the piezoelectric film, the acoustic impedance layer including a low acoustic impedance layer having a relatively low acoustic impedance and a high acoustic impedance layer having a relatively high acoustic impedance that are alternately layered.

19. The multiplexer according to claim 11, wherein an inductor, a capacitor, or a longitudinally coupled resonator is inserted among the one or more series arm resonators, the one or more parallel arm resonators, the first and second input-output terminals, and the ground.

20. The multiplexer according to claim 11, wherein the acoustic wave filter is a band-pass ladder filter.

* * * * *